United States Patent
Chi

(10) Patent No.: US 10,054,634 B2
(45) Date of Patent: Aug. 21, 2018

(54) TEST DEVICE

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 140 days.

(21) Appl. No.: 14/928,656

(22) Filed: Oct. 30, 2015

(65) Prior Publication Data

US 2016/0349321 A1    Dec. 1, 2016

(30) Foreign Application Priority Data

May 26, 2015 (KR) .................. 10-2015-0073036

(51) Int. Cl.
    *G01R 31/317* (2006.01)
    *G11C 29/56* (2006.01)

(52) U.S. Cl.
    CPC ........ *G01R 31/31724* (2013.01); *G11C 29/56* (2013.01)

(58) Field of Classification Search
    CPC .................................. G01R 1/31724
    See application file for complete search history.

(56) References Cited

U.S. PATENT DOCUMENTS

| | | | | |
|---|---|---|---|---|
| 3,614,608 A * | 10/1971 | Giedd | ................ | G01R 31/3193 324/133 |
| 3,636,443 A * | 1/1972 | Singh | ................. | G01R 31/3193 714/736 |
| 4,710,932 A * | 12/1987 | Hiroshi | ................ | G01R 31/317 714/736 |
| 6,298,449 B1* | 10/2001 | Carter | ...................... | G06F 1/30 713/340 |
| 6,452,411 B1* | 9/2002 | Miller | ................ | G01R 31/3193 324/754.07 |
| 7,133,797 B2* | 11/2006 | Shimizu | ........... | G01R 31/31703 324/500 |
| 7,853,844 B2* | 12/2010 | Sasagawa | ........ | G01R 31/31708 714/25 |
| 9,642,027 B2* | 5/2017 | Schmidt | ................ | H04W 24/08 |
| 2011/0179324 A1* | 7/2011 | Lai | ................... | G11C 29/56008 714/723 |

FOREIGN PATENT DOCUMENTS

KR    1020130035555    4/2013

* cited by examiner

Primary Examiner — Steve Nguyen
(74) Attorney, Agent, or Firm — IP & T Group LLP

(57) ABSTRACT

A test device includes: a test control unit suitable for detecting a deterioration-expected unit circuit among a plurality of unit circuits included in a test-subject device according to operation histories of the plural unit circuits, and detecting a deterioration degree according to a test output value of the deterioration-expected unit circuit; and an interface unit suitable for routing control operation results and test results between the test control unit and the test-subject device during a test operation.

4 Claims, 4 Drawing Sheets

US 10,054,634 B2

TEST DEVICE

CROSS-REFERENCE TO RELATED APPLICATIONS

The present application claims priority of Korean Patent Application No. 10-2015-0073036, filed on May 26, 2015, which is incorporated herein by reference in its entirety.

BACKGROUND

1. Field

Exemplary embodiments of the present invention relate to a semiconductor design technology, and more particularly, to a test device capable of testing a semiconductor device.

2. Description of the Related Art

Semiconductor devices such as Double Data Rate Synchronous DRAM (DDR SDRAM) go through test operations before being commercialized. Only semiconductor devices that pass all testing procedures are commercialized and sold to consumers. The purpose testing is to ensure that the semiconductor devices perform properly. Test operations are performed at every step in the fabrication of semiconductor memory devices so that no further resources are spent continuing to process defective devices. Therefore, to keep manufacturing costs low as possible, it is very important to eliminate defective semiconductor devices during the initial stages of fabrication.

SUMMARY

Various embodiments are directed to a test device capable of detecting deterioration in a specific region.

In accordance with an embodiment of the present invention, a test device may include: a test control unit suitable for detecting a deterioration-expected unit circuit among a plurality of unit circuits included in a test-subject device according to operation histories of the plural unit circuits, and detecting a deterioration degree according to a test output value of the deterioration-expected unit circuit; and an interface unit suitable for routing control operation results and test results between the test control unit and the test-subject device during a test operation.

Each of the operation histories may include one or more of number of activations, activation time, and current consumption of the plural unit circuits.

The test control unit may include: a first test driving unit suitable for controlling the test-subject device to perform a normal operation; a circuit operation detection unit suitable for detecting the operation histories of the plural unit circuits; a second test driving unit suitable for controlling the deterioration-expected unit circuit to perform a circuit operation, wherein the deterioration-expected unit circuit corresponds to an output signal of the circuit operation detection unit; a test comparison unit suitable for comparing a test output value of the deterioration-expected unit circuit to an expected value; and a deterioration detection unit suitable for detecting deterioration degrees of the deterioration-expected unit circuit according to an output signal of the test comparison unit.

In accordance with another embodiment of the present invention, an operating method of a test device may include: performing a normal operation on a test-subject device; acquiring operation histories of a plurality of unit circuits included in the test-subject device through the normal operation; detecting a deterioration-expected unit circuit among the plural unit circuits according to the operation histories; and detecting a deterioration degree of the deterioration-expected unit circuit by comparing a test data value generated through an operation of the deterioration-expected unit circuit to an expected value.

Each of the operation histories may include one or more of a number of activations, activation time, and current consumption of the plural unit circuits.

In accordance with yet another embodiment of the present invention, a semiconductor system may include: a test control unit suitable for detecting a deterioration-expected unit circuit among a plurality of unit circuits included in a test-subject device according to operation histories of the plural unit circuits, and generating deterioration degrees as analysis result information of different normal operations according to a test output value of the deterioration-expected unit circuit; and an option control unit suitable for replacing a deterioration-confirmed unit circuit of the test-subject device with a replacement unit circuit in response to the analysis result information, wherein the test-subject device performs a corresponding one among the different normal operations in response to an output signal of the option control unit.

The semiconductor device may include: a normal operation unit suitable for performing a predetermined normal operation; a replacement operation unit suitable for replacing the normal operation unit; and a selection unit suitable for selectively using the normal operation and the replacement operation unit in response to the analysis result information.

The test control unit may include: a first test driving unit suitable for controlling the test-subject device to perform a normal operation; a circuit operation detection unit suitable for detecting the operation histories of the plural unit circuits; a second test driving unit suitable for controlling the deterioration-expected unit circuit to perform a circuit operation, wherein the deterioration-expected unit circuit corresponds to an output signal of the circuit operation detection unit; a test comparison unit suitable for comparing a test output value of the deterioration-expected unit circuit to an expected value; and a deterioration detection unit suitable for detecting deterioration degrees of the deterioration-expected unit circuit according to an output signal of the test comparison unit.

In accordance with yet another embodiment of the present invention, a semiconductor system may include: a test control unit suitable for detecting a deterioration-expected unit circuit among a plurality of unit circuits included in a test-subject device according to operation histories corresponding to normal operations of the plural unit circuits, and detecting a deterioration degree according to a test output value of the deterioration-expected unit circuit, wherein the test-subject device alternately activates a plurality of driving units to perform the same operation according to the deterioration degree.

The semiconductor device may include an enable control unit for controlling activation of the plural driving units.

The test control unit may include: a first test driving unit suitable for controlling the test-subject device to perform a normal operation; a circuit operation detection unit suitable for detecting the operation histories of the plural unit circuits; a second test driving unit suitable for controlling the deterioration-expected unit circuit to perform a circuit operation, wherein the deterioration-expected unit circuit corresponds to an output signal of the circuit operation detection unit; a test comparison unit suitable for comparing a test output value of the deterioration-expected unit circuit to an expected value; and a deterioration detection unit suitable for detecting deterioration degrees of the deterioration-expected unit circuit according to an output signal of the test comparison unit.

BRIEF DESCRIPTION OF THE DRAWINGS

FIG. is a block diagram illustrating a test device in accordance with an embodiment of the present invention.

DETAILED DESCRIPTION

Figure 1:
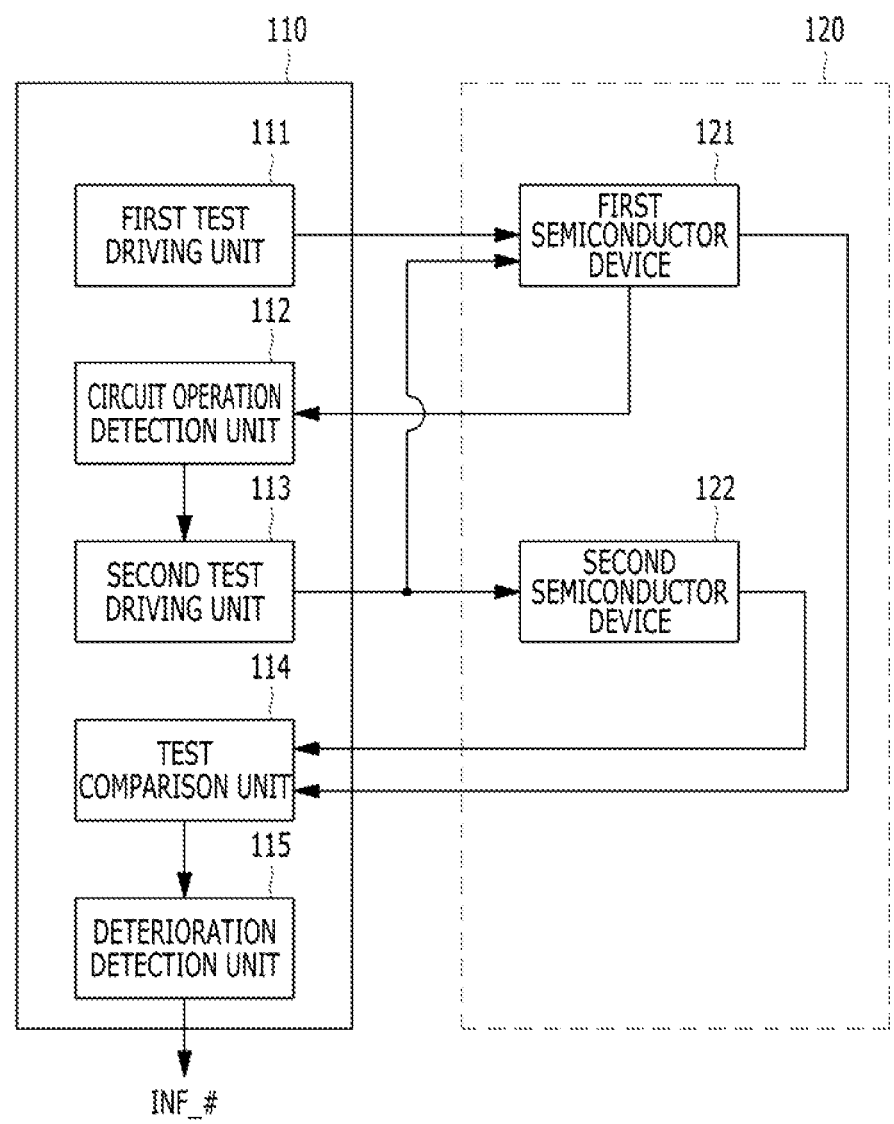

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a test device in accordance with an embodiment of the present invention.

Referring to FIG. 1, the test device may include a test control unit 110 and a test interface unit 120.

First and second semiconductor devices 121 and 122 may have the same structure while the first semiconductor device 121 is subject to a test and the second semiconductor device 122 may be a reference device without any deterioration. Each of the first semiconductor device 121 and a second semiconductor device 122 may include a plurality of unit circuits. The unit circuit may indicate a circuit physically or functionally identified as a single unit. For example, a transistor configured in a delay circuit may be the unit circuit while the delay circuit itself may be the unit circuit.

The first semiconductor device 121 may have a deterioration-expected unit circuit and a deterioration-confirmed unit circuit unit circuit while the second semiconductor device 122 may have a plurality of reference unit circuits without any deterioration, which will be described later.

In accordance with an exemplary embodiment of the present invention, both of the first and second semiconductor devices 121 and 122 may be driven in order to compare a test output value of the first semiconductor device 121 with an expected value of the second semiconductor device 122. As another example, the test device may include a register storing the expected value, instead of implementing the second semiconductor device 122.

The test control unit 110 may detect the deterioration degree of the first semiconductor device 121, and include a first test driving unit 111, a circuit operation detection unit 112, a second test driving unit 113, a test comparison unit 114, and a deterioration detection unit 115.

The first test driving unit 111 may perform a first test operation to control the first semiconductor device 121 to perform a normal operation. During the first test operation, the first semiconductor device 121 may perform a normal operation through the first test driving unit 111. The type and number of normal operations may vary according to a test operation.

The circuit operation detection unit 112 may detect operation histories of the plural unit circuits included in the first semiconductor device 121. The operation history may indicate the operation state of the corresponding unit circuit during a normal operation. For example, the operation history may indicate one or more of a number of activations, activation time, and current consumption of the corresponding unit circuit. Further, the circuit operation detection unit 112 may detect the unit circuit with many activations, a long activation time, or a high current consumption as the deterioration-expected unit circuit based on the detected operation histories of the plural unit circuits in the first semiconductor device 121. The deterioration-expected unit circuit may have the operation history representing high likelihood of a problem, and may correspond to a signal outputted from the circuit operation detection unit 112.

The second test driving unit 113 may perform a second test operation to control the deterioration-expected unit circuit and a corresponding one of the plural reference unit circuits to perform a circuit operation. As described above, the deterioration-expected unit circuit may be included in the first semiconductor device 121 while the reference unit circuit may be included in the second semiconductor device 122. During the second test operation, the second test driving unit 113 may control the deterioration-expected unit circuit to perform the circuit operation.

The test comparison unit 114 may compare the test output value outputted from the deterioration-expected unit circuit driven by the second test driving unit 113 with the expected value outputted from a reference unit circuit driven by the second test driving unit 113 among plural reference unit circuits of the second semiconductor device 122, and provide a result value to the deterioration detection unit 115.

The deterioration detection unit 115 may detect the deterioration degree of the deterioration-expected unit circuit in response to the result value provided from the test comparison unit 114, and output the detected deterioration degree as analysis result information INF_#. The deterioration degree may include a value indicating how much the deterioration-expected unit circuit is deteriorated, and also include a value indicating whether the deterioration-expected unit circuit is deteriorated.

The test interface unit 120 may route control operation results and the test results among the test control unit 110 and the first and second semiconductor device 121 and 122.

During the first test operation, the first test driving unit 111 may control the first semiconductor device 121 to perform a normal operation. The purpose of the first test operation is to control the first semiconductor device 121 to continuously perform a normal operation, thereby determining which unit circuit has many activations, a long activation time, or a high current consumption among the plural unit circuits in the first semiconductor device 121.

The circuit operation detection unit 112 may detect the unit circuit with many activations, long activation time, or high current consumption as the deterioration-expected unit circuit.

Upon detection of the deterioration-expected unit circuit, the test control unit 110 may determine whether the deterioration-expected unit circuit has a bad influence on circuit operation performance, through the second test operation, thereby detecting whether the deterioration-expected unit circuit is deteriorated or detecting the deterioration-expected unit circuit as a deterioration-confirmed unit circuit.

In an example where a certain unit circuit of the first semiconductor device 121 is previously activated 6,195 times through normal operations, the unit circuit may be expected to be deteriorated as much. However, the substantial operation performance of the deterioration-expected unit circuit may not be degraded. Thus the test output value of the deterioration-expected unit circuit of 6,195 activations in the first semiconductor device 121 may be compared to the expected value corresponding to the reference unit circuit of the second semiconductor device 122, which is not deteriorated. When the values are equal to each other, the deterioration-expected unit circuit of 6,195 activations in the first semiconductor device 121 may be determined as not deteriorated. However, when the values are different from each other, the deterioration-expected unit circuit of 6,195 activations in the first semiconductor device 121 may be determined as the deterioration-confirmed unit circuit.

The test device in accordance with the embodiment of the present invention can detect the unit circuit of high likelihood of a problem as the deterioration-expected unit circuit among the plural unit circuits in the first semiconductor device through the first test operation, and detect the deterioration-expected unit circuit as the deterioration-confirmed unit circuit through the second test operation.

Figure 2:
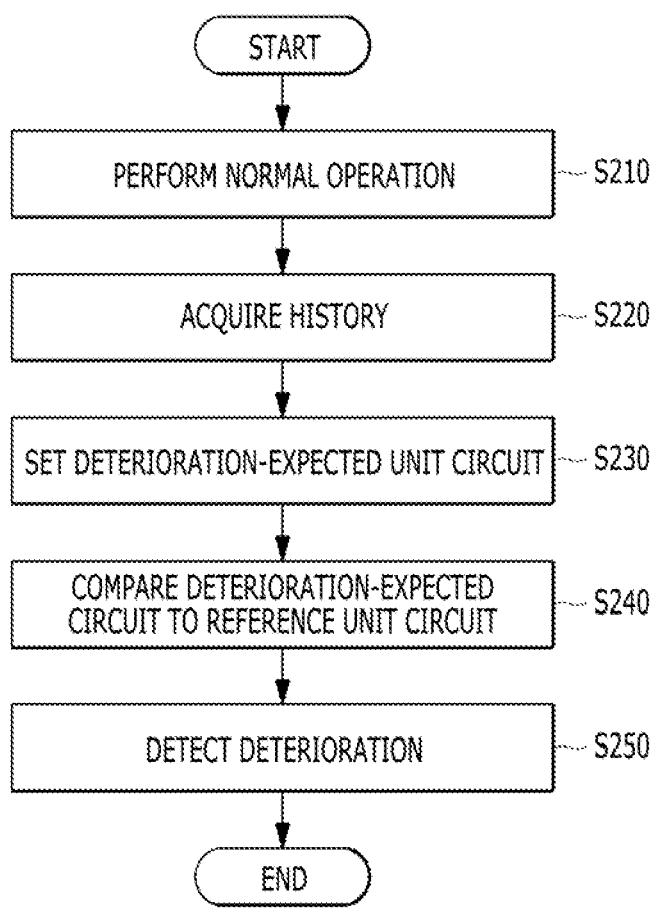
FIG. 2 is a flowchart illustrating an operation of the test device of FIG. 1.

FIG. 2 is a flowchart illustrating the operation of the test device described with reference to FIG. 1.

Referring to FIGS. 1 and 2, at step S210, the first semiconductor device 121 may perform a normal operation under the control of the first test driving unit 111.

At step S220, the test device may acquire the operation histories. During the normal operation, the test device may detect all of the operation histories for the plural unit circuits included in the first semiconductor device 121.

At step S230, the test device may detect the deterioration-expected unit circuit. The test device may analyze all of the operation histories for the plural unit circuits included in the first semiconductor device 121, and detect the unit circuit of high likelihood of a problem as the deterioration-expected unit circuit among the plural unit circuits. The test device may detect the unit circuit with many activations, long activation time, or high current consumption as the deterioration-expected unit circuit.

At step S240, the test device may compare the test output values of the deterioration-expected unit circuit and the corresponding reference unit circuit of the second semiconductor device 122. The test device may perform the second test operation to control the deterioration-expected unit circuit and the corresponding reference unit circuit to perform a circuit operation. Since the reference unit circuit of the second semiconductor device 122 is not deteriorated, the reference unit circuit of the second semiconductor device 122 may output a proper expected test output value which is compared to the test output value of the deterioration-expected unit circuit of the first semiconductor device 121.

At step S250, the test device may detect deterioration. Based on a result of the comparison of step S240, the test device may analyze whether the deterioration-expected unit circuit of the first semiconductor device 121 has an influence on operation performance, and detect the deterioration-expected unit circuit as the deterioration-confirmed unit circuit.

The test device in accordance with the embodiment of the present invention may acquire the operation histories of the plural unit circuits, and detect the deterioration-expected unit circuit using the operation histories. Then, the test device may detect the operation performance of the deterioration-expected unit circuit and detect the deterioration-confirmed unit circuit.

Figure 3:
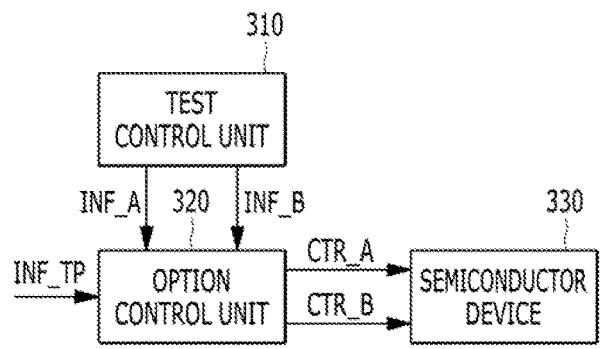
FIG. 3 is a block diagram illustrating a test device in accordance with another embodiment of the present invention.

FIG. 3 is a block diagram illustrating a test device in accordance with another embodiment of the present invention.

In accordance with an exemplary embodiment of the present invention, the test device may include a replacement unit circuit for replacing the deterioration-confirmed unit circuit, and replace the deterioration-confirmed unit circuit with the replacement unit circuit according to the deterioration degree detected through the test operation. Although embodiments of the present invention are not limited to a semiconductor memory device, a semiconductor device will be taken as an example in the following descriptions.

Referring to FIG. 3, the test device may include a test control unit 310 and an option control unit 320. A semiconductor device 330 coupled to the test device may correspond to the first semiconductor memory device 121 having the plural unit circuits, and may further include a replacement operation unit 440, which will be described later.

The test control unit 310 may generate analysis result information from different normal operations through a test operation, and may be the same as the test device described with reference to FIGS. 1 and 2. As described above, the deterioration detection unit 115 may output the detected deterioration degree as analysis result information INF_#. The deterioration degree may include a value indicating how much the deterioration-expected unit circuit is deteriorated, and also include a value indicating whether the deterioration-expected unit circuit is deteriorated. The analysis result information INF_# will be described as first analysis result information INF_A and second analysis result information INF_B. Suppose that the test control unit 310 can perform first and second normal operations, generate the first analysis result information INF_A as a result of the first normal operation, and generate the second analysis result information INF_B as a result of the second normal operation. The first analysis result information INF_A may have information on the deterioration-confirmed unit circuit for the first normal operation, and the second analysis result information INF_B may have information on the deterioration-confirmed unit circuit for the second normal operation. The first and second normal operation may have the same purpose but may be involved with different unit circuits.

The option control unit 320 may store the first and second analysis result information INF_A and INF_B, and provide one of the first and second analysis result information INF_A and INF_B to the semiconductor device 330 according to type information INF_TP. For example, the option control unit 320 may provide first and second selection control signals CTR_A and CTR_B corresponding to the first analysis result information INF_A to the semiconductor device 330 according to type information INF_TP. The type information INF_TP may represent one of the first and second normal operations.

The semiconductor device 330 may include the replacement unit circuit for replacing the deterioration-confirmed unit circuit, and replace the deterioration-confirmed unit circuit with the replacement unit circuit according to the first and second selection control signals CTR_A and CTR_B.

The test device in accordance with the embodiment of the present invention may detect the deterioration-confirmed unit circuits according to various types of normal operations, and replace the deterioration-confirmed unit circuit of the semiconductor device with the replacement unit circuit or a more reliable circuit.

Figure 4:
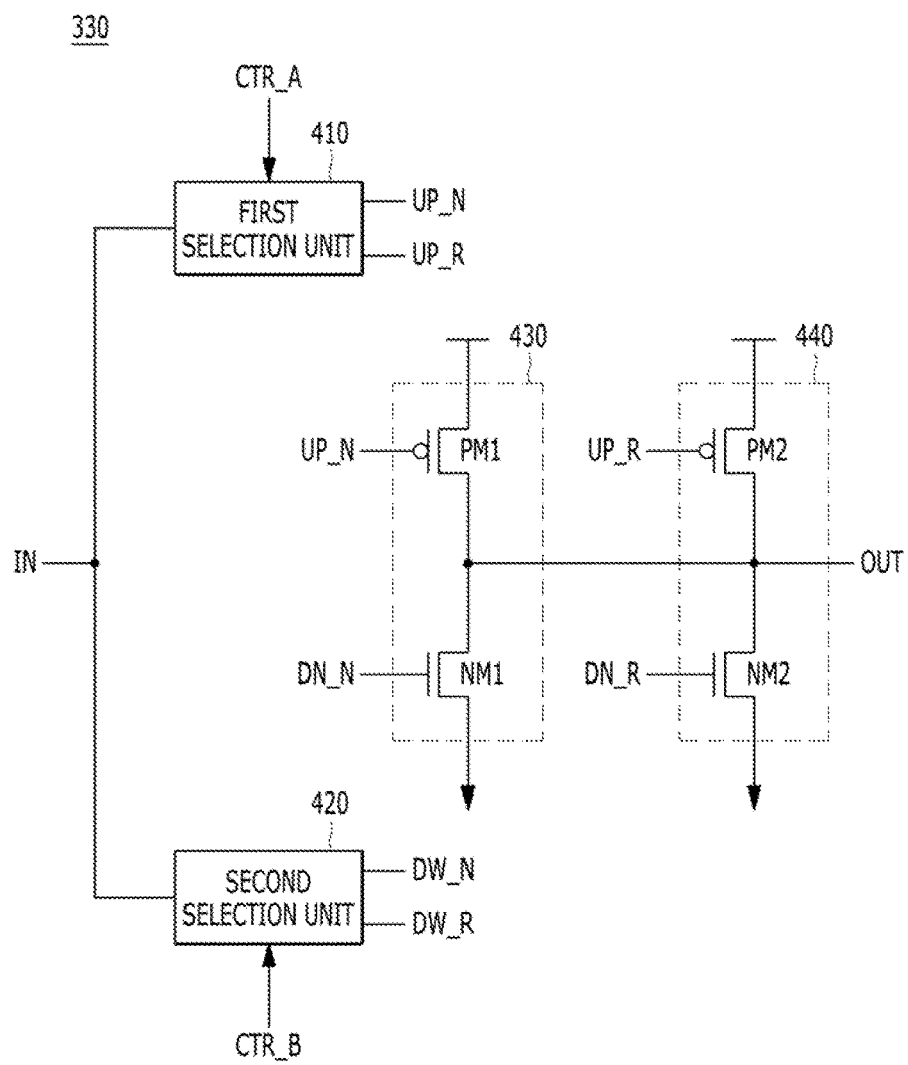
FIG. 4 is a block diagram partly illustrating a semiconductor device shown in FIG. 2.

FIG. 4 is a block diagram partly illustrating the semiconductor device 330 described with reference to FIG. 2.

Referring to FIG. 4, the semiconductor device 300 may include a first selection unit 410, a second selection unit 420, the normal operation unit 430, and the replacement operation unit 440. The normal operation unit 430 may include the plural unit circuit included in the first semiconductor device 121. One or more of the plural unit circuits in the normal operation unit 430 may be the deterioration-confirmed unit circuits described with reference to FIGS. 1 and 2. The replacement operation unit 440 may have the same structure as the normal operation unit 430. The replacement operation unit 440 may have different structure from the normal operation unit 430 while having one or more same unit circuits as the normal operation unit 430.

The first selection unit 410 may selectively output an input signal IN to the normal operation unit 430 or the replacement operation unit 440 in response to the first selection control signal CTR_A. The input signal IN may be outputted as a normal-up control signal UP_N or replacement-up control signal UP_R in response to the first selection control signal CTR_A. The first selection unit 410 may include a latch circuit capable of storing the first selection control signal CTR_A and a MUX circuit capable of selectively outputting the input signal IN in response to the first selection control signal CTR_A.

The second selection unit 420 may selectively output the input signal IN to the normal operation unit 430 or the replacement operation unit 440 in response to the second selection control signal CTR_B. The input signal IN may be outputted as a normal-down control signal DN_N or replacement-down control signal DN_R in response to the second selection control signal CTR_B. The second selection unit 420 may have similar structure to the first selection unit 410.

For example, the normal operation unit 430 may drive an output terminal OUT in response to the normal-up control signal UP_N and the normal-down control signal DN_N, and include a first PMOS transistor PM1 and a first NMOS transistor NM1. The replacement operation unit 440 may drive the output terminal OUT in response to the replacement-up control signal UP_R and the replacement-down control signal DN_R, and include a second PMOS transistor PM2 and a second NMOS transistor NM2. Although the normal operation unit 430 and the replacement operation unit 440 are exemplified as the driving circuits, the unit circuit 430 and the replacement unit circuit 440 may vary.

Suppose that the normal operation unit 430 includes the deterioration-confirmed unit circuit for both of the first and second normal operations. For example, the first PMOS transistor PM1 of the normal operation unit 430 is the deterioration-confirmed unit circuit for the first normal operation while the first NMOS transistor NM1 of the normal operation unit 430 is the deterioration-confirmed unit circuit for the second normal operation.

Referring to FIGS. 3 and 4, a semiconductor device for the first normal operation will be described.

The test control unit 310 may generate the first analysis result information INF_A through the deterioration detection test operation described with reference to FIGS. 1 and 2. The first analysis result information INF_A may indicate that the first PMOS transistor PM1 of the normal operation unit 430 is the deterioration-confirmed unit circuit for the first normal operation. For example, a PMOS transistor may be deteriorated to have decreased threshold value due to having a lot of activation time or many activations. Thus, the second PMOS transistor PM2 of the replacement operation unit 440 to replace the first PMOS transistor PM1 of the normal operation unit 430 may be implemented to have the threshold voltage value without decrease even though there has been many activations or a lot of activation time. The first selection unit 410 may output the input signal IN as the replacement-up control signal UP_R in response to the first selection control signal CTR_A. Thus, the second PMOS transistor PM2 may be activated in response to the input signal IN instead of the first PMOS transistor PM1.

As a result of the deterioration detection test operation and the replacement, in the semiconductor device for the first normal operation, the second PMOS transistor PM2 and the first NMOS transistor NM1 may operate in response to the input signal IN.

Referring to FIGS. 3 and 4, a semiconductor device for the second operation will be described.

The test control unit 310 may generate the second analysis result information INF_B through the deterioration detection test operation described with reference to FIGS. 1 and 2. The second analysis result information INF_B may indicate that the first NMOS transistor NM1 of the normal operation unit 430 is the deterioration-confirmed unit circuit for the second normal operation. For example, an NMOS transistor may be deteriorated to have increased threshold value due to many activations or a lot of activation time. Thus, the second NMOS transistor NM2 of the replacement operation unit 440 to replace the first NMOS transistor NM1 of the normal operation unit 430 may be implemented to have the threshold voltage without increase even though it has been enabled a long time or many times. The second selection unit 420 may output the input signal IN as the replacement-down control signal DN_R in response to the second selection control signal CTR_B. Thus, the second NMOS transistor NM2 may be activated in response to the input signal IN instead of the first NMOS transistor NM1.

As a result of the deterioration detection test operation and the replacement, in the semiconductor device for the second normal operation, the first PMOS transistor PM1 and the second NMOS transistor NM2 may operate in response to the input signal IN.

The test device in accordance with the embodiment of the present invention may provide information on the deterioration-confirmed unit circuit detected through the test operation to a semiconductor device which can be commonly used. Thus, the test device can control the semiconductor device to operate a more stable replacement unit circuit in place of the deterioration-confirmed unit circuit.

Figure 5:
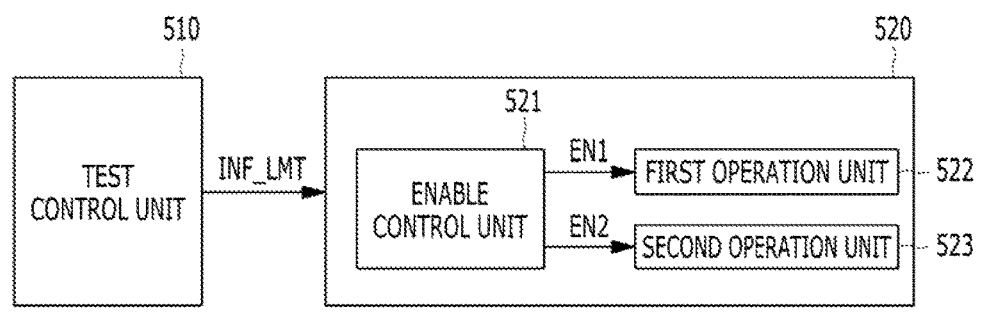
FIG. 5 is a block diagram illustrating a semiconductor system in accordance with another embodiment of the present invention.

FIG. 5 is a block diagram illustrating a semiconductor system in accordance with another embodiment of the present invention.

Referring to FIG. 5, the semiconductor system may include a test control unit 510 and a semiconductor device 520. The semiconductor device 520 coupled to the test control unit 510 may correspond to the first semiconductor memory device 121 having the plural unit circuits in a first operation unit 522, and may further include a second operation unit 523 having the same structure as the first operation unit 522, which will be described later.

The test control unit 510 may generate information corresponding to a deterioration degree through a test operation, and may be the same as the test device described with reference to FIGS. 1 and 2. As described above, the deterioration detection unit 115 may output the detected deterioration degree as analysis result information INF_#. The deterioration degree may include a value indicating how much the deterioration-expected unit circuit is deteriorated, and also include a value indicating whether the deterioration-expected unit circuit is deteriorated. The analysis result information INF_# may include a predetermined deterioration threshold for each of the plural unit circuits in the semiconductor device 520. The analysis result information INF_# will be described as deterioration limit information INF_LMT including the predetermined deterioration threshold.

Then, the semiconductor device 520 may perform a predetermined operation in response to the deterioration limit information INF_LMT and include an enable control unit 521 and the first and second operation units 522 and 523.

The enable control unit 521 may alternately activate the first and second operation units 522 and 523 through first and second enable signals EN1 and EN2 according to the deterioration limit information INF_LMT, and the first and second operation units 522 and 523 may operate in response to the first and second enable signals EN1 and EN2. The first and second operation units 522 and 523 may perform the same operation in terms of function.

Suppose that the first operation unit 522 is deteriorated when activated 50,000 times. The information on 50,000 times may be included as the predetermined deterioration threshold in the deterioration limit information INF_LMT.

The enable control unit 521 may generate the first and second enable signals EN1 and EN2 according to the deterioration limit information INF_LMT, and the first and second operation units 522 and 523 may perform an operation in response to the first and second enable signals EN1 and EN2. At this time, the first and second enable signals EN1 and EN2 may be generated in 2 different ways.

A first way is to operate the second operation unit 523 after the first operation unit 522 is activated 50,000 times in response to the first enable signal EN1. A second way is to alternately operate the first and second operation units 522 and 523. Since the first and second operation units 522 and 523 perform the same operation, a normal operation may be performed without any problems even though any one of the two operation units performs the normal operation. Furthermore, although the first operation unit 522 may be activated 50,000 times, further operations can be normally performed by the second operation unit 523.

The semiconductor system in accordance with the embodiment of the present invention may detect a deterioration degree, and replace a specific unit circuit of the semiconductor device before the specific unit circuit is deteriorated. Thus, the semiconductor system may prevent the occurrence of deterioration.

In the present embodiment, it has been described that the semiconductor device is tested and applied. However, the test operation can be applied to a simulation operation before process. That is, during a simulation operation using a netlist, a deterioration-expected unit circuit may be set using the netlist obtained by performing normal operations. Then, the netlist and a normal netlist may be compared to detect a deterioration-confirmed unit circuit. Furthermore, when such information is provided to a designer, the designer can design a semiconductor device using the information. The designed semiconductor device may not be deteriorated even though the semiconductor device performs a normal operation.

As described above, the test device in accordance with an embodiment of the present invention may perform a normal operation to set deterioration-expected unit circuits, and detect a deterioration-confirmed unit circuit from the deterioration-expected unit circuits. Furthermore, the detected information may be used to design a more reliable semiconductor device.

In accordance with the embodiment of the present invention, the test device may previously detect deterioration occurring in a semiconductor device which is intended to be fabricated, and reflect the detected deterioration into the semiconductor device fabrication step, thereby increasing the operation reliability of the commercialized semiconductor device.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed is:
1. A test device comprising:
a test control unit suitable for detecting a deterioration-expected unit circuit among a plurality of unit circuits included in a test-subject device according to operation histories of the plurality of unit circuits, and detecting a deterioration degree according to a test output value of the deterioration-expected unit circuit; and
an interface unit suitable for routing control operation results and test results between the test control unit and the test-subject device during a test operation,
wherein the test control unit comprises:
a first test driving unit suitable for controlling the test-subject device to perform a normal operation;
a circuit operation detection unit suitable for detecting the operation histories indicating operation states of the respective unit circuits during the normal operation, and outputting a signal corresponding to the deterioration-expected unit circuit among the plurality of unit circuits, which is detected based on the operation histories of the plurality of unit circuits;
a second test driving unit suitable for controlling the deterioration-expected unit circuit among the plurality of unit circuits to perform a circuit operation;
a test comparison unit suitable for comparing a test output value of the deterioration-expected unit circuit to an expected value; and
a deterioration detection unit suitable for detecting deterioration degrees of the deterioration-expected unit circuit according to an output signal of the test comparison unit.
2. The test device of claim 1, wherein each of the operation histories comprises one or more of number of activations, activation time, and current consumption of the plurality of unit circuits.
3. An operating method of a test device, comprising:
performing a normal operation on a test-subject device at a first test driving unit;
acquiring operation histories of a plurality of unit circuits included in the test-subject device through the normal operation at a circuit operation detection unit, the operation histories indicating operation states of the respective unit circuits during the normal operation;
detecting a deterioration-expected unit circuit among the plurality of unit circuits according to the operation histories of the plurality of unit circuits and outputting a signal corresponding to the deterioration-expected unit circuit among the plurality of unit circuits at the circuit operation detection unit;

controlling the deterioration-expected unit circuit among the plurality of unit circuits to perform a circuit operation at a second test driving unit;

comparing a test data value generated through an operation of the deterioration-expected unit circuit to an expected value at a test comparison unit; and detecting a deterioration degree of the deterioration-expected unit circuit according to a result of the detecting the deterioration-expected unit circuit at a deterioration detection unit.

4. The operating method of claim 3, wherein each of the operation histories comprises one or more of a number of activations, activation time, and current consumption of the plurality of unit circuits.

* * * * *